(12) United States Patent
Nagai et al.

(10) Patent No.: US 8,216,365 B2
(45) Date of Patent: *Jul. 10, 2012

(54) METHOD FOR PRODUCING A SEMICONDUCTOR CRYSTAL

(75) Inventors: Seiji Nagai, Aichi-ken (JP); Shiro Yamazaki, Aichi-ken (JP); Takayuki Sato, Aichi-ken (JP); Katsuhiro Imai, Aichi-ken (JP); Makoto Iwai, Aichi-ken (JP); Takatomo Sasaki, Osaka-fu (JP); Yusuke Mori, Osaka-fu (JP); Fumio Kawamura, Osaka-fu (JP)

(73) Assignee: Toyoda Gosei Co., Ltd., Nishikasugai-gun, Aichi-ken (JP)

(*) Notice: Subject to any disclaimer, the term of this patent is extended or adjusted under 35 U.S.C. 154(b) by 110 days.

This patent is subject to a terminal disclaimer.

(21) Appl. No.: 12/073,178

(22) Filed: Feb. 29, 2008

(65) Prior Publication Data

US 2008/0223286 A1 Sep. 18, 2008

(30) Foreign Application Priority Data

Mar. 2, 2007 (JP) ................................. 2007-053321

(51) Int. Cl.
C30B 25/18 (2006.01)
(52) U.S. Cl. ............ 117/88; 117/89; 117/102; 423/109; 438/690
(58) Field of Classification Search .................. 438/460; 423/109; 117/88, 89, 102
See application file for complete search history.

(56) References Cited

U.S. PATENT DOCUMENTS

| | | | | |
|---|---|---|---|---|
| 3,809,010 A | * | 5/1974 | Springthorpe | 118/429 |
| 4,032,370 A | * | 6/1977 | Matare | 117/60 |
| 4,123,302 A | * | 10/1978 | Marinelli | 117/57 |
| 4,159,694 A | * | 7/1979 | Marinelli | 118/401 |

(Continued)

FOREIGN PATENT DOCUMENTS

JP 2005-187317 7/2005

(Continued)

OTHER PUBLICATIONS

NN82056595: High Temperature Process Furnace. May 1982. IBM Technical Disclosure Bulletin, US.*

(Continued)

*Primary Examiner* — Bob M Kunemund
(74) *Attorney, Agent, or Firm* — McGinn IP Law Group, PLLC

(57) ABSTRACT

Objects of the invention are to further enhance crystallinity and crystallinity uniformity of a semiconductor crystal produced through the flux method, and to effectively enhance the production yield of the semiconductor crystal. The c-axis of a seed crystal including a GaN single-crystal layer is aligned in a horizontal direction (y-axis direction), one a-axis of the seed crystal is aligned in the vertical direction, and one m-axis is aligned in the x-axis direction. Thus, three contact points at which a supporting tool contacts the seed crystal are present on m-plane. The supporting tool has two supporting members, which extend in the vertical direction. One supporting member has an end part, which is inclined at 30° with respect to the horizontal plane α. The reasons for supporting a seed crystal at m-plane thereof are that m-plane exhibits a crystal growth rate, which is lower than that of a-plane, and that desired crystal growth on c-plane is not inhibited. Actually, a plurality of seed crystals and supporting tools are periodically placed along the y-axis direction.

18 Claims, 5 Drawing Sheets

P1, P2 and P3 are contact points on m-plane

U.S. PATENT DOCUMENTS

| | | | |
|---|---|---|---|
| 4,191,365 A * | 3/1980 | O'Neill | 269/46 |
| 4,236,947 A * | 12/1980 | Baliga | 117/56 |
| 5,443,032 A * | 8/1995 | Vichr et al. | 117/84 |
| 5,953,581 A * | 9/1999 | Yamasaki et al. | 438/22 |
| 6,953,506 B2 * | 10/2005 | Iwane et al. | 117/206 |
| 6,964,705 B2 * | 11/2005 | Nagai et al. | 117/90 |
| 7,052,979 B2 * | 5/2006 | Nagai et al. | 438/478 |
| 7,132,730 B2 * | 11/2006 | Dwilinski et al. | 257/615 |
| 7,288,151 B2 * | 10/2007 | Sasaki et al. | 117/78 |
| 7,420,261 B2 * | 9/2008 | Dwilinski et al. | 257/615 |
| 7,755,172 B2 * | 7/2010 | Hashimoto et al. | 257/627 |
| 2005/0142391 A1 * | 6/2005 | Dmitriev et al. | 428/698 |
| 2005/0153471 A1 * | 7/2005 | Sasaki et al. | 438/29 |
| 2008/0001165 A1 * | 1/2008 | Hashimoto et al. | 257/103 |
| 2008/0081015 A1 * | 4/2008 | Sarayama et al. | 423/409 |
| 2008/0223286 A1 * | 9/2008 | Nagai et al. | 117/88 |
| 2008/0271665 A1 * | 11/2008 | Yamazaki et al. | 117/13 |
| 2009/0092815 A1 * | 4/2009 | Dmitriev et al. | 428/220 |
| 2009/0286063 A2 * | 11/2009 | Dmitriev et al. | 428/220 |

FOREIGN PATENT DOCUMENTS

| | | |
|---|---|---|
| JP | 2005-194146 | 7/2005 |
| JP | 2005187317 A * | 7/2005 |

OTHER PUBLICATIONS

NN81102397: Liquid Phase Epitaxy Furnace With Separate Preheat and Postcool Sections. Oct. 1981.IBM Technical Disclosure Bulletin, US.*

* cited by examiner

P1, P2 and P3 are contact points on m-plane

Fig. 4-A
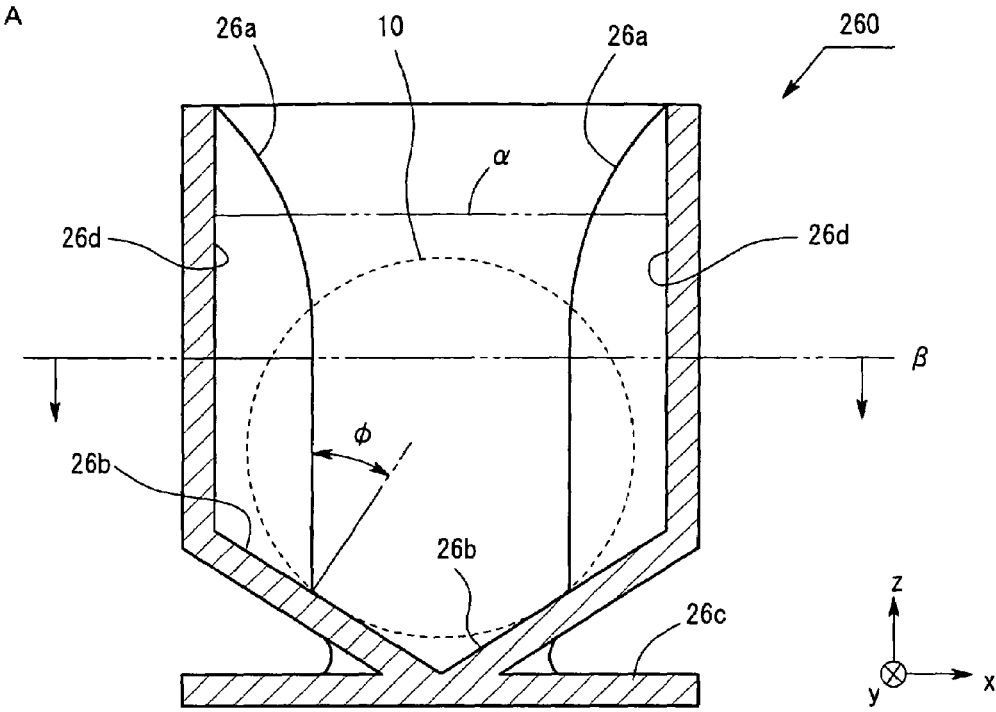
Fig. 4-B
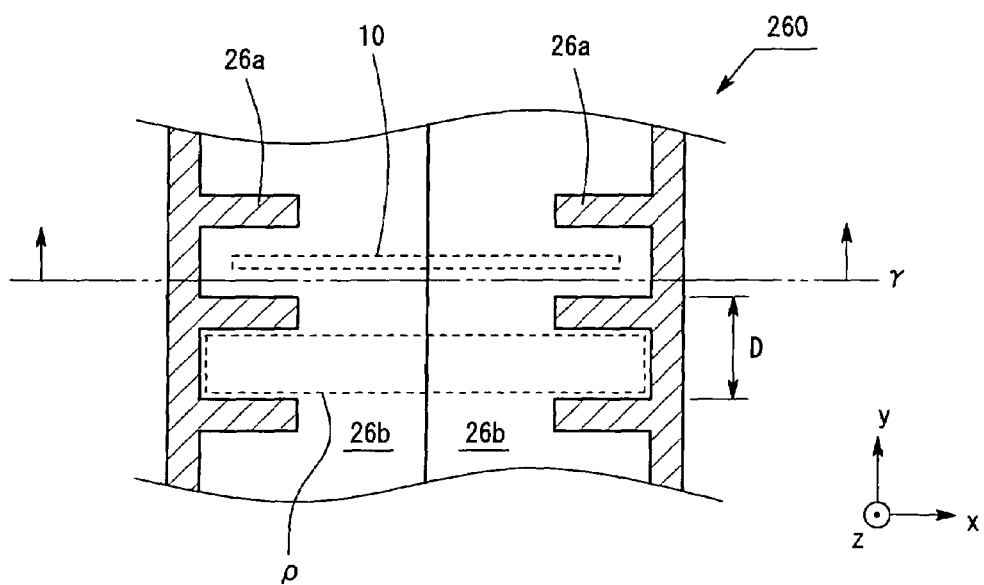

METHOD FOR PRODUCING A SEMICONDUCTOR CRYSTAL

BACKGROUND OF THE INVENTION

1. Field of the Invention

The present invention relates to a method for producing a semiconductor crystal based on the growth of a Group III nitride-based compound semiconductor crystal through the flux method.

2. Background Art

Hitherto, the flux method has been employed for producing Group III nitride-based compound semiconductor crystals. Japanese Patent Application Laid-Open (kokai) No. 2005-194146 and other documents disclose such production methods. In those conventional production methods, a plate-form seed crystal is horizontally positioned at the bottom of a crucible, and a semiconductor layer is grown atop the seed crystal. Generally, only one seed crystal plate is placed in a crucible.

Japanese Patent Application Laid-Open (kokai) No. 2005-187317 discloses a similar crystal growth method in which a plurality of plate-form seed crystals are vertically held in a growth apparatus. Each seed crystal plate has a surface of growth (hereinafter referred to as growth surface) which assumes the (001) plane. This publication does not disclose in detail the manner of holding a plurality of seed crystal plates.

According to the aforementioned conventional methods, effective utilization of the interior of the employed crucibles is not satisfactorily attained. Thus, conventional production methods encounter difficulty in ensuring sufficiently high production efficiency. Also, when a seed crystal plate is horizontally placed at the bottom of a crucible, a raw material solution is not supplied uniformly to the growth surface of the seed crystal plate, making it difficult to produce a semiconductor crystal of interest with highly uniform quality.

SUMMARY OF THE INVENTION

The present invention is intended to solve the aforementioned problems, and an object of the present invention is to further enhance crystallinity of a semiconductor crystal produced through the flux method and uniformity in crystallinity. Another object of the invention is to effectively enhance the production yield of the semiconductor crystal.

In order to solve the aforementioned problems, the following means are effective.

As the first aspect of the invention, the present invention provides a method for producing a semiconductor crystal in which a Group III nitride-based compound semiconductor crystal is grown by reacting nitrogen (N) with a Group III element of gallium (Ga), aluminum (Al), or indium (In) in a flux mixture containing an alkali metal, which method comprises placing, in a crucible, one or more plate-form seed crystals each having a c-plane as a growth surface, and supporting each seed crystal at m-plane thereof by means of a supporting tool, to thereby maintain the c-axis of the seed crystal in a horizontal direction or in an inclined direction within 45° with respect to the horizontal direction.

The c-axis of each seed crystal is more preferably maintained in an inclined direction within 30° with respect to the horizontal direction.

Each seed crystal plate is supported at a side face thereof by means of a supporting tool. Two to six side surfaces of m-plane may be supported.

The c-axis is preferably maintained in a horizontal direction to a maximum extent. When the crucible is caused to swing, the c-axis angle may be maintained, on average, at 0° (a horizontal direction) or within 45°.

The aforementioned Group III nitride-based compound semiconductor includes any of 2-, 3-, and 4-component mixed-crystal semiconductors represented by formula $Al_{1-x-y}Ga_yIn_xN$ ($0 \leq x \leq 1$, $0 \leq y \leq 1$, $0 \leq 1-x-y \leq 1$). The Group III nitride-based compound semiconductor also encompasses such semiconductors to which a p-type or an n-type impurity has been added.

As the second aspect of the invention, the present invention provides a method for producing a semiconductor crystal in which a group III nitride-based compound semiconductor crystal is grown by reacting nitrogen (N) with a Group III element of gallium (Ga), aluminum (Al), or indium (In) in a flux mixture containing an alkali metal, which method comprises placing one or more plate-form seed crystals in a crucible whose interior is divided into a plurality of small spaces by means of a guide member or a partition member, and supporting each seed crystal by means of the guide member or the partition member to prevent falling of the seed crystal, to thereby maintain a line normal to a crystal growth surface of the seed crystal in a horizontal direction or in an inclined direction within 45° with respect to the horizontal direction.

However, preferably, the aforementioned small spaces are not completely isolated by walls or similar members, but are brought into communication with one another such that a flux (raw material solution) can be sufficiently moved to and from individual small spaces. Thus, the partition member employed may have a shape of rod, lattice, net, circle, spiral, etc. The guide member is provided for guiding a plate-form seed crystal to a predetermined position in a small space in the crucible, and may be formed as, for example, a member protruding from the inner wall of the crucible. Alternatively, the aforementioned partition member having a shape of rod, lattice, etc. may also serve as the guide member.

The line normal to the growth surface is preferably maintained in a horizontal direction to a maximum extent. When the crucible is caused to swing, the line normal to the growth surface may be maintained, on average, in a horizontal direction or in an inclined direction within 45° with respect to the horizontal direction.

As the third aspect of the invention, the present invention provides a production method according to the first or second aspects, wherein two or more of said seed crystals are placed together in the crucible, to thereby provide at least one seed crystal pair, and planes of the paired seed crystals on which crystal growth is least expected are maintained such that the planes face each other closely or are in close contact with each other. Here the planes on which crystal growth is least expected means the planes on which good crystal does not grow and include the planes on which a little crystal or an irregular crystal grows.

For example, when seed crystals having a main plane assuming c-plane are employed, preferably, N-planes (nitrogen planes) of the crystals are maintained such that the planes face each other closely or are in close contact with each other. With this configuration, crystal growth occurring on Ga-planes (gallium planes) exposed to the outside is satisfactorily promoted, while crystal growth on N-planes on which effective crystal growth is least expected is effectively prevented.

According to the aforementioned means of the invention, the aforementioned problem can be effectively or rationally solved.

The means according to the present invention provide the following effects.

Specifically, according to the first and second aspects of the invention, crystal growth surfaces of the plate-form crystals are placed vertically or in an inclined direction with respect to the vertical direction, whereby seed crystals can be effectively placed at high density in the crucible. With this configuration, flow of a raw material solution through thermal convection or forced convection occurs in a crucible along the crystal growth surface of each seed crystal. Therefore, the raw material solution can be uniformly and sufficiently fed to the entirety of the crystal growth surface.

Thus, according to the present invention, crystal growth rate can be enhanced, and crystallinity of a semiconductor crystal and uniformity in crystallinity can be further effectively improved, as compared with conventional methods.

Therefore, according to the present invention, quality, yield, and production efficiency of semiconductor crystals can be remarkably enhanced as compared with conventional methods.

When the crystal growth surface (main plane) of a plate-form seed crystal is c-plane, the side surfaces of the seed crystal assume a-plane or m-plane. According to the first aspect of the invention, during growth on c-plane, a seed crystal is supported at an m-plane side surface thereof which exhibits a crystal growth rate considerably lower than that of a-plane, and the c-plane is not supported by a supporting tool. Therefore, cracking of a plate-form target semiconductor crystal, which would otherwise be caused by crystal growth on a supported portion of the seed crystal, can be prevented. Also, inhibition of crystal growth on c-plane along the c-axis can be prevented.

According to the second aspect of the invention, a seed crystal can be placed vertically or in an inclined direction with respect to the vertical direction, and the placement direction can be maintained, even though strong supporting force is not applied to the seed crystal. Therefore, cracking of a target semiconductor crystal, which would otherwise be caused by crystal growth on a supported portion of the seed crystal along the direction of supporting force, can be prevented. Also, inhibition of crystal growth on c-plane along the c-axis can be prevented.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which:

FIG. 4A is a cross section of a crucible 260 employed in Embodiment 2;

FIG. 4B is a cross section of a crucible 260 employed in Embodiment 2; and

DETAILED DESCRIPTION OF PREFERRED EMBODIMENTS

Figure 1:
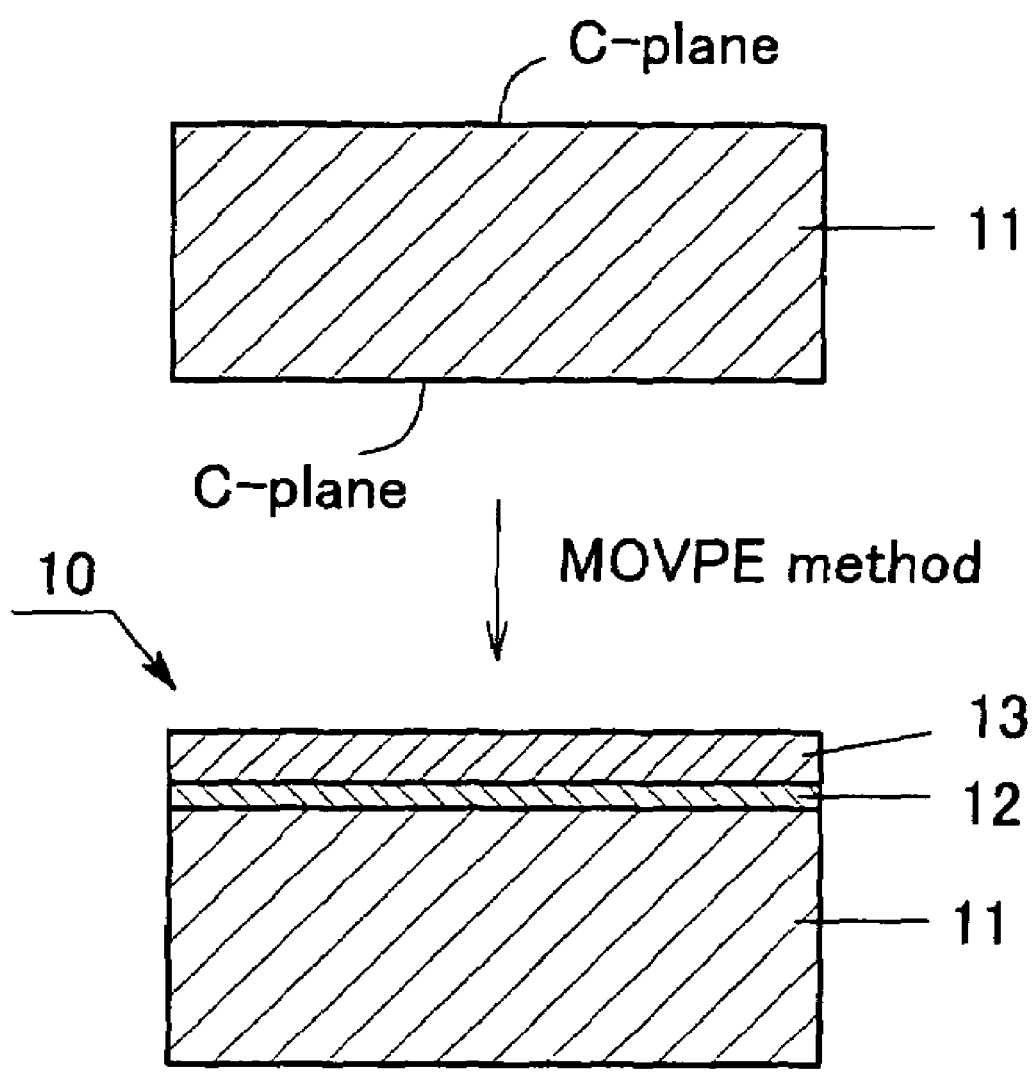
FIG. 1 gives cross-sections showing steps of forming a base substrate (template 10) employed in Embodiment 1.

Preferably, the a-plane and c-plane of a seed crystal are sustained in a crucible such that the planes do not receive strong supporting force (pressure) from the inner wall or other members of the crucible. More preferably, a seed crystal is held in a non-contact state with the inner wall or other members.

When the second aspect of the invention is employed, one or two seed crystals are preferably placed in one small space. In the case where two seed crystals are placed in one small space, preferably, planes of the seed crystals on which crystal growth is least expected face each other.

Specifically, when seed crystals are produced by sequentially forming a buffer layer and a GaN single-crystal film at low temperature on a crystal growth surface—a main plane of a plate-form sapphire substrate—through MOVPE or a similar technique, and a semiconductor crystal is grown on the produced seed crystals through the aforementioned method, the produced seed crystals are preferably placed in a small space such that back surfaces of the sapphire substrates face each other. In the second means, when self-standing bulk GaN substrates are employed as seed crystals, the seed crystals are preferably placed in a small space such that nitrogen planes of the self-standing GaN substrates face each other.

When an employed seed crystal contains a sapphire substrate as at least one component, at least a part of the sapphire substrate may be melted, dissolved, corroded, or removed in a flux during crystal growth, depending on the crystal growth conditions. In such a case, when a seed crystal is placed at such a position that allows sufficient contact of flux convection with the sapphire substrate, sapphire can be readily melted, dissolved, corroded, or removed in the flux, whereby a self-standing bulk single crystal is produced.

Notably, the buffer layer is stacked on the crystal growth surface, or the GaN layer is stacked on the buffer layer, generally through a technique such as MOVPE. However, any film formation method may be employed in the present invention. Other techniques such as the flux method, HVPE, and MBE are effectively employed for producing a seed crystal and a base substrate. Preferably, the buffer layer is grown at low temperature, and has a thickness of about 10 nm to about 200 nm. The buffer layer may have a multilayer structure or a complex layer structure. The buffer layer may be formed through sputtering at high temperature.

Reaction in the flux between the Group III element and nitrogen is performed more preferably at 500° C. to 1,100° C., still more preferably about 850° C. to about 900° C. and preferably at a nitrogen-containing gas pressure of 0.1 MPa to 6 MPa, more preferably about 4.0 MPa to about 5.0 MPa. Use of ammonia gas ($NH_3$) may lower the pressure of the atmosphere. The nitrogen gas employed may be in a plasma state.

To a target Group III nitride-based compound semiconductor crystal, an impurity may be added. Examples of the impurity which may be added to the flux mixture include boron (B), thallium (Tl), calcium (Ca) or compounds containing calcium (Ca), silicon (Si), sulfur (S), selenium (Se), tellurium (Te), carbon (C), oxygen (O), aluminum (Al), indium (In), alumina ($Al_2O_3$), indium nitride (InN), silicon nitride ($Si_3N_4$), silicon oxide ($SiO_2$), indium oxide ($In_2O_3$), zinc (Zn), magnesium (Mg), strontium (Sr), barium (Ba), zinc oxide (ZnO), magnesium oxide (MgO), and germanium (Ge).

These impurities may be used singly or in combination of two or more species. That is, these impurities may be used in any combination. It is not necessary to always use these impurities. Through addition of these impurities, physical properties of a target semiconductor crystal such as bandgap, electrical conductivity, and lattice constant can be tuned to desired values.

In order to mitigate or prevent melting of a seed crystal (a Group III nitride-based compound semiconductor crystal), which is included in the base substrate, in the flux before initiation of the target crystal growth through the flux method, a nitride such as $Ca_3N_2$, $Li_3N$, $NaN_3$, BN, $Si_3N_4$, or InN may be incorporated into the flux in advance. By virtue of the presence of these nitrides in the flux, the nitrogen content of the flux increases, whereby melting of the seed crystal in the flux before initiation of the target crystal growth can be successfully prevented or mitigated.

No particular limitation is imposed on the crystal growth apparatus employed in the invention, and any apparatus may be employed, so long as the flux method can be carried out by means of the apparatus. For example, a growth apparatus disclosed in the aforementioned Patent Documents may be employed. The temperature of a reaction chamber of the crystal growth apparatus for the growth based on the flux method is preferably controllable to about 1,000° C. The pressure of the reaction chamber is preferably controllable to about 100 atm (about $1.0 \times 10^7$ Pa). The elements of the crystal growth apparatus including an electric furnace, a stainless steel vessel (reaction vessel), a raw material gas tank, and piping, are preferably formed of a heat- and pressure-resistant material such as stainless steel (SUS) material or an alumina material.

For generally the same reason, the crucible is preferably formed from a metal, nitride, or oxide (e.g., W, Mo, alumina, or PBN).

The crystal growth apparatus employed in the invention may have means for swinging a raw material solution and a seed crystal. Such swinging means provides a stirring effect on the raw material solution. Therefore, the raw material solution may be fed more uniformly to the crystal growth surface. Swinging can be attained at a minimum swinging frequency of about 10 times/min.

No particular limitation is imposed on the dimensions and the thickness of the seed crystal and the base substrate. However, in consideration of industrial utility in practice, shapes such as a circle (diameter of about 20 mm to about 100 mm) and squares are more preferred. The radius of curvature of the crystal growth surface of the seed crystal or that of the base substrate is preferably large.

Specific embodiments of the present invention will next be described.

However, these embodiments should not be construed as limiting the invention thereto.

Embodiment 1

Steps included in Embodiment 1 of crystal growth based on the flux method will next be described.

1. Production of a Base Substrate

FIG. 1 gives cross-sections showing steps of forming a base substrate (template 10) employed in Embodiment 1. In this step, an AlN buffer layer 12 (20 nm) is grown, through MOVPE, on a sapphire substrate 11 (diameter: about 50 mm, thickness: about 450 μm) having a main plane assuming c-plane. Subsequently, a single-crystal GaN layer 13 (about 10 μm) is deposited on the buffer layer. The GaN layer 13 may be dissolved in a flux to some extent by the time of initiation of growth of a target semiconductor crystal based on the flux method. Therefore, the GaN layer 13 is formed to have such a thickness that it is not completely dissolved in the flux until crystal growth is initiated. Through the procedure, the growth surface of the GaN layer 13; i.e., the surface which is not in contact with the buffer layer 12, assumes a Ga plane.

Alternatively, in order to prevent or mitigate such dissolution of a seed crystal, a nitride such as $Ca_3N_2$, $Li_3N$, $NaN_3$, BN, $Si_3N_4$, or InN may be incorporated into the flux in advance; for example, before the crystal growth process as described hereinbelow.

2. Configuration of Crystal Growth Apparatus

Figure 2:
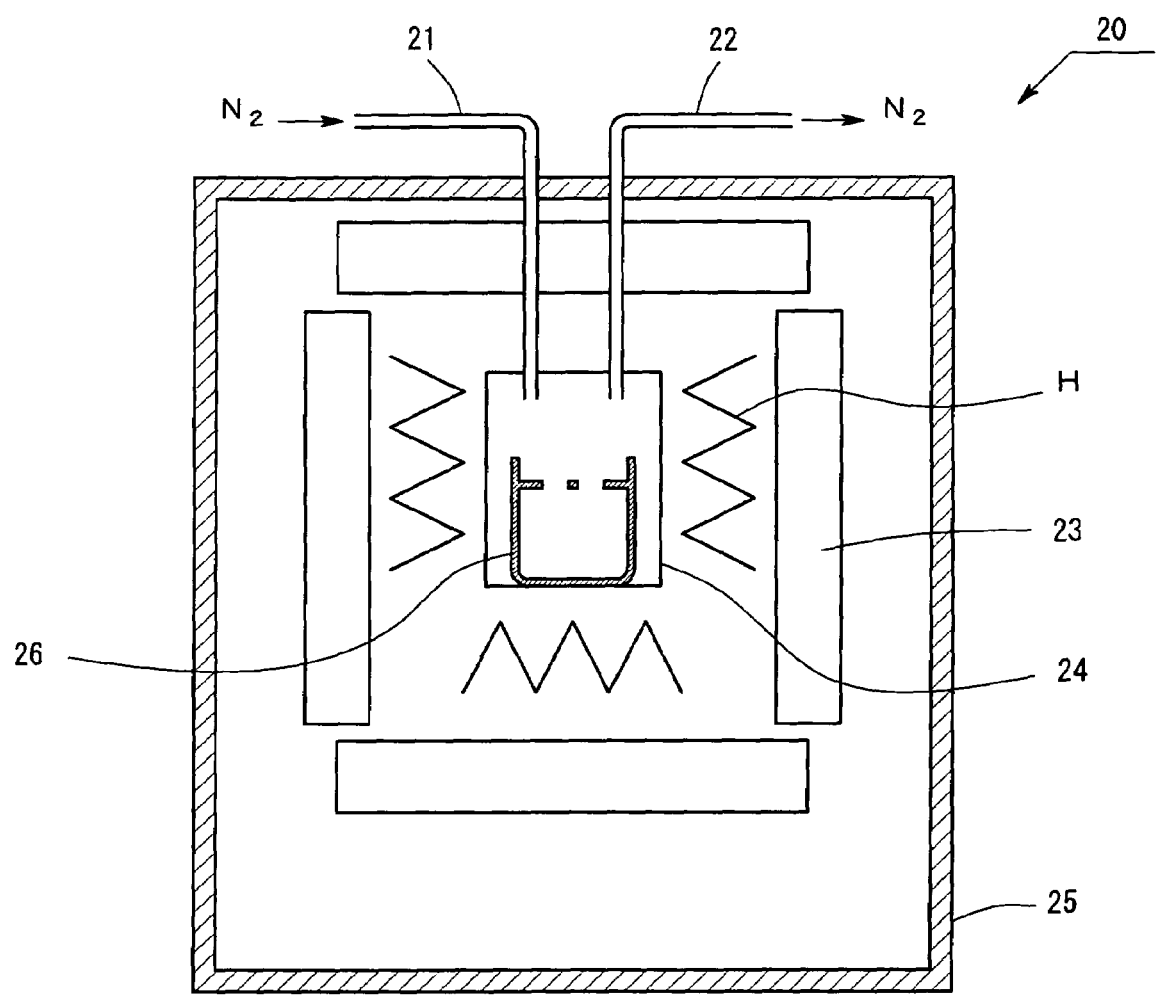
FIG. 2 is a cross section of a crystal growth apparatus 20 employed in Embodiment 1.
Figure 3:
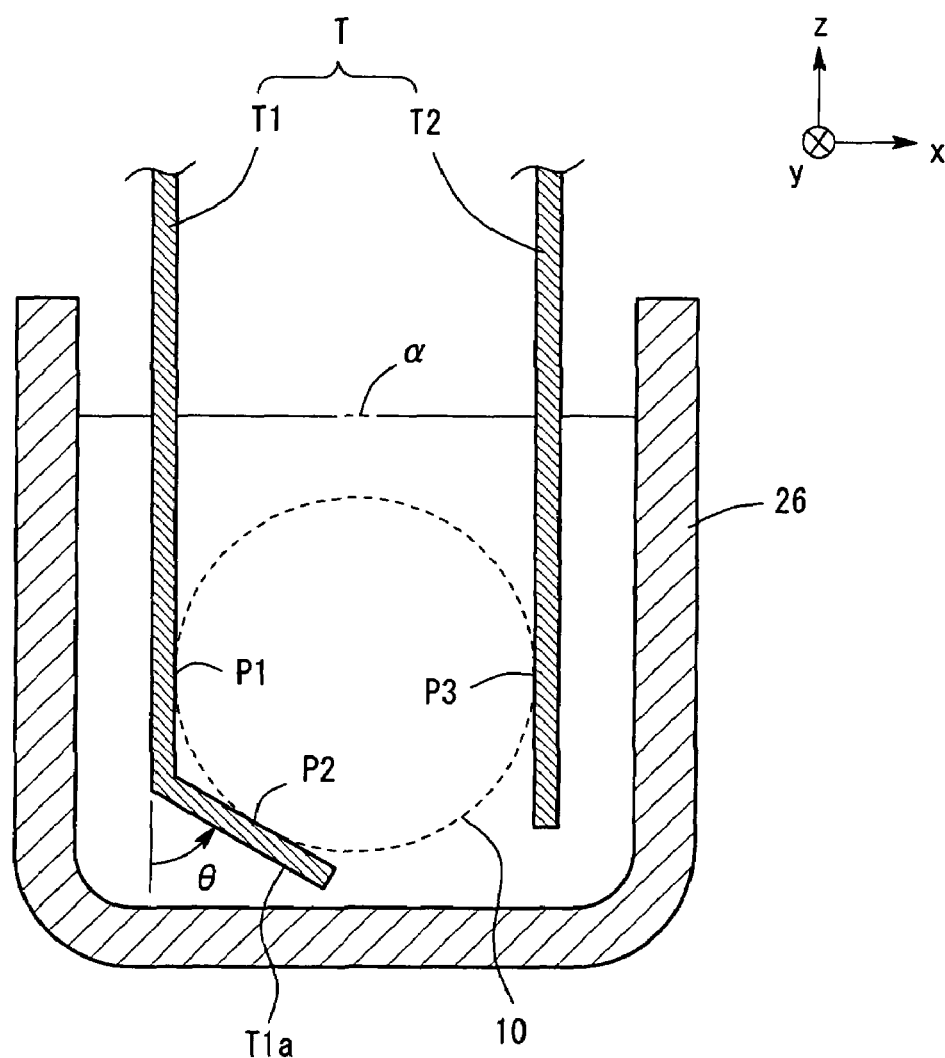
FIG. 3 is a cross section of a crucible 26 employed in Embodiment 1.

FIGS. 2 and 3 show the configuration of a crystal growth apparatus 20 employed in Embodiment 1. The crystal growth apparatus 20, for performing a crystal growth process based on the flux method, has a pressure vessel 25 equipped with a gas feed piping 21 for feeding a high-temperature, high-pressure nitrogen gas ($N_2$) and a gas discharge piping 22 for discharging nitrogen gas. The pressure vessel contains a heater H, a thermal insulator 23, and a stainless steel vessel 24. The pressure vessel 25, the gas feed piping 21, the gas discharge piping 22, etc. are formed of a stainless steel (SUS) material or an alumina material, in consideration of heat resistance, pressure resistance, reactivity, etc.

The stainless steel vessel 24 includes a crucible 26 (reaction vessel) therein. The crucible 26 may be formed of, for example, a material such as tungsten (W), molybdenum (Mo), boron nitride (BN), pyrolytic boron nitride (PBN), or alumina ($Al_2O_3$).

The temperature of the interior of the pressure vessel 25 may be raised or lowered as desired, so long as the temperature does not exceed 1,000° C. The pressure of the crystal growth atmosphere in the stainless steel vessel 24 may be increased or decreased as desired, so long as the pressure does not exceed $1.0 \times 10^7$ Pa.

FIG. 3 is a cross section of a crucible 26. A horizontal plane α denotes the position of the upper surface of a flux which is added to the crucible. A circle shown by a broken line in the center of FIG. 3 represents the position at which the template 10 of FIG. 1 is placed. In other words, the entirety of each seed crystal is placed in the flux, and the c-axis of the GaN layer 13, which corresponds to the target crystal growth direction, is aligned in a horizontal direction; i.e., aligns with the y-axis illustrated in FIG. 3. In the template 10 shown in FIG. 3, one a-axis of the seed crystal (GaN layer 13) is aligned in the vertical direction (z-axis direction), while one m-axis is aligned in the horizontal direction (x-axis direction), which is normal to the c-axis. Thus, contact points p1 and p3 at which a supporting tool T contacts a seed crystal are present on m-plane. As used herein, the term "m-axis" refers to an axis normal to the m-plane, and the term "m-plane" refers to (10-10) plane and an equivalent plane thereof. The same definition is applied to a-plane (e.g., (11-20) plane), c-plane (e.g., (0001) plane), a-axis, and c-axis.

The supporting tool T has supporting members T1 and T2 which extend in the vertical (downward) direction. The supporting member T1 is bent so that the lower portion thereof and the vertical line form an angle (θ) of 60°. Thus, the end portion T1a is inclined at 30° with respect to the horizontal plane α. A contact point p2 at which the end portion T1a contacts the seed crystal is present on m-plane. The reason for supporting a seed crystal at m-plane thereof is that since the m-plane exhibits a crystal growth rate considerably lower than that of a-plane, holding the seed crystal at its m-plane produces smaller stress acting on the target semiconductor crystal. In this mode of supporting, cracks in the target semiconductor crystal, which would otherwise be generated by the stress applied to the semiconductor crystal, can be prevented.

The crucible 26 has a length in the y-axis direction (crystal growth direction) longer than that in the x-axis direction. Actually, a plurality of templates 10 and supporting tools T are periodically placed along the y-axis direction. The intervals between the neighboring templates (or supporting tools) may be about 3 mm to about 1 cm.

3. Crystal Growth Step

Next will be described the crystal growth step of Embodiment 1 employing the aforementioned crystal growth apparatus.

(1) Firstly, sodium (Na) (90 g) and gallium (Ga) (105 g) are placed in the reaction vessel (crucible 26), and the reaction vessel (crucible 26) is placed in the reaction chamber (stainless steel vessel 24) of the crystal growth apparatus, followed by evacuation of the gas contained in the reaction chamber.

When such an operation is performed in air, Na is immediately oxidized. Therefore, setting of the substrate or the raw materials in the reaction vessel is carried out in a glove box filled with an inert gas (e.g., Ar gas). If necessary, any of the aforementioned additives (e.g., an alkaline earth metal) may be added to the crucible in advance.

(2) Subsequently, while the temperature of the crucible is regulated to about 880° C., nitrogen gas ($N_2$) is fed into the reaction chamber of the crystal growth apparatus, whereby the nitrogen gas ($N_2$) pressure in the reaction chamber is maintained at about 4.5 MPa. In this case, the sapphire substrate 11 forming the template 10 is immersed in a flux melt (flux mixture) formed through the temperature elevation. As shown in FIG. 3, seed crystals (GaN single crystal 13 of the template 10) are placed in the crucible 26 and horizontally supported at m-plane thereof by means of the supporting tool T such that the c-axis of each seed crystal is aligned in the horizontal direction and the a-axis thereof is maintained in the vertical direction.

The crystal growth surface (GaN single crystal 13) is preferably immersed in the flux mixture continuously during the above step. Also preferably, the nitrogen gas component ($N_2$ or N) in the atmosphere is sufficiently and continuously incorporated into a melt through, for example, convection such as thermal convection generated by means of a heater H. Through convection of the flux mixture, the growth rate of a target semiconductor crystal can also be enhanced. Also through this convection, the dissolution rate of the sapphire substrate in the flux can be enhanced in some cases.

(3) Thereafter, convection of the flux mixture is continuously generated, whereby the flux mixture is stirred, and crystal growth is continued under the crystal growth conditions as described in (2) above which are maintained for about 200 hours.

Under the above-described conditions, the atoms constituting the material for producing a Group III nitride compound semiconductor (Ga and N) are continuously in a supersaturated state in the vicinity of the crystal growth surface. Therefore, a target semiconductor crystal (GaN single crystal) can be successfully grown on the crystal growth surface of the template 10 (FIG. 1).

4. Removal of Flux

Subsequently, the above-grown GaN single crystal (target semiconductor crystal) is removed from the reaction chamber of the crystal growth apparatus, and the single crystal is cooled to 30° C. or lower. Thereafter, while the temperature of the atmosphere surrounding the GaN single crystal is also maintained at 30° C. or lower, the flux (Na) deposited on the periphery of the single crystal is removed by use of ethanol.

When the above-described steps are carried out sequentially, a plurality of high-quality semiconductor single crystals (grown GaN single crystals) can be simultaneously produced in a single crucible at remarkably low cost as compared with conventional methods. The thus-produced semiconductor crystals each have almost the same surface area as that of the sapphire substrate 11 as shown in FIG. 1 and a thickness (along c-axis) of about 2 mm, and have no breakages or cracks.

Embodiment 2

FIGS. 4A and 4B are cross sections of a crucible 260 employed in Embodiment 2. FIG. 4B is a cross-section of the crucible 260, as viewed from a cross-section β shown in FIG. 4A, while FIG. 4A is a cross-section of the crucible 260, as viewed from a cross-section y shown in FIG. 4B.

The crucible 260 is formed from alumina. A circle shown by a broken line in the center of FIG. 4A represents the position at which the template 10 of Embodiment 1 is placed. The crucible 260 is characterized in that plate-form guide members 26a are vertically provided in the crucible 260 such that the members protrude inward from an inner surface 26d, and in that a bottom surface 26b of the crucible 260 is an inclined surface. The inner surfaces 26d, 26d vertically extend and face each other in parallel. The line normal to each guide member 26a is aligned in the horizontal direction and is parallel to the crystal growth direction (i.e., c-axis or y-axis direction). The angle between the line normal to the bottom surface 26b and the vertical line is an angle (θ) of 30°.

The crucible 260 may be formed of a material such as tungsten (W), molybdenum (Mo), boron nitride (BN), or pyrolytic boron nitride (PBN).

The crucible 260 is formed in a plane symmetric manner with respect to a vertical plane including the y-axis passing the centroid of the crucible. The main vessel body of the crucible stands on a base member 26c having a horizontal back surface. The plate-form guide members 26a are periodically provided along the crystal growth direction (i.e., c-axis or y-axis direction). The intervals D between the neighboring guide members may be about 3 mm to about 1 cm, and the full length of the crucible 260 in the y-axis direction may be adjusted as desired. The interior of the crucible 260 is partitioned by means of the guide members 26a, to thereby provide a large number of small spaces ρ, which are provided at intervals D along the y-axis direction. Thus, as shown in FIG. 4B, the templates 10 can be vertically installed in each small space ρ. In one small space ρ, one or two templates 10 are placed, depending on the length of D. When two templates are vertically placed in one small space ρ, the templates are preferably placed such that the sapphire substrates 11 face each other in order to promote crystal growth on c-plane.

Similar to Embodiment 1 (FIG. 3), in Embodiment 2, the c-axis is aligned in the horizontal direction (y-axis direction), and one a-axis of each seed crystal is aligned in the vertical direction (z-axis direction). Thus, among six m-planes of the seed crystal, four m-planes are placed in parallel with respect to two bottom surfaces 26b, 26b and to two inner surfaces 26d, 26d, and the two bottom surfaces 26b, 26b are in contact with the m-planes, respectively. That is, the m-plane of the seed crystal is in contact with the bottom surfaces 26b, 26b on at least 2 points, and the a-plane of the seed crystal is not in contact with any inner surface. As a result, stress applied to a target semiconductor crystal is weakened. Similar to Embodiment 1, the stress is reduced due to a crystal growth rate on the m-plane, which is lower than that on the a-plane. Through employment of the crucible 260, cracks in the target semiconductor crystal, which would otherwise be generated by the stress applied to the semiconductor crystal, can be prevented.

Since the small spaces ρ are communicated with one another along the y-axis direction in the crucible 260, the distribution of flux in the crucible is uniform in any direction. Therefore, through employment of the crucible 260, a plurality of semiconductor crystals can be produced with remarkably high and uniform quality.

Embodiment 3

Figure 5:
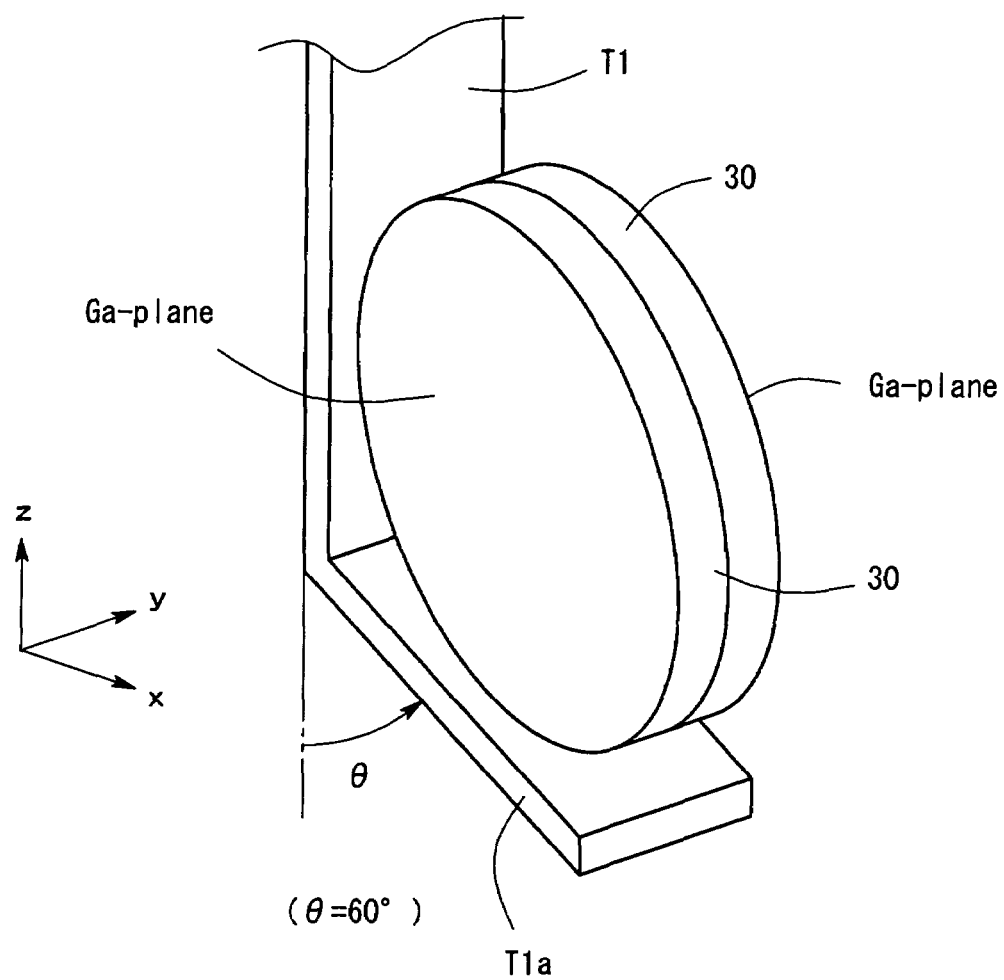
FIG. 5 is a perspective view showing a variation in usage of a supporting tool T.

In Embodiment 3, crystal growth is performed through employment of a plurality of pairs of self-standing bulk single-crystal GaN disks (crystal growth substrates 30) as shown in FIG. 5. A characteristic feature of Embodiment 3 is that two crystal growth substrates 30 of a pair are bound together such that N-planes (nitrogen planes) are in contact with each other, and each substrate pair is supported by means of one supporting tool T.

FIG. 5 shows an example of usage of a supporting tool T (FIG. 3) employed in Embodiment 3. In FIG. 5, a supporting member T1 constitutes the supporting tool T shown in FIG. 3. The supporting member T1 and the other supporting member T2 (not illustrated) are used in a manner similar to that of Embodiment 1. Each crystal growth substrate 30 has the same configuration as employed in Embodiment 1. Specifically, one a-axis is aligned in the vertical direction (z-axis direction), and the c-axis (y-axis) and one m-axis (x-axis) are aligned in a horizontal direction.

Similar to Embodiment 1, a plurality of supporting tools T are placed along the crystal growth direction (c-axis or y-axis direction).

Thus, for completely the same reason as mentioned in relation to Embodiment 1, cracks in the produced target semiconductor crystals grown on these seed crystals (crystal growth substrates 30), which would otherwise be caused by the aforementioned stress, can be prevented.

In addition, since two crystal growth substrates 30 are brought into contact with each other such that the N-planes face each other, Ga-planes are exposed to the outside. Thus, a flux is sufficiently fed to Ga-planes, on which crystal growth effectively occurs, thereby effectively promoting crystal growth, while the flux is not sufficiently fed to N-planes, on which effective crystal growth is least expected, thereby effectively inhibiting crystal growth.

As a result, according to the supporting manner of Embodiment 3, crystal growth can be effectively carried out on c-plane.

When the crucible 260 of Embodiment 2 (FIGS. 4A and 4B) is employed in Embodiment 3, two crystal growth substrates 30 are placed in each small space ρ of the crucible 260 in a manner similar to that of Embodiment 3. Similar to the aforementioned case, a flux is sufficiently fed to Ga-planes, on which crystal growth effectively occurs, thereby effectively promoting crystal growth, while the flux is not sufficiently fed to N-planes, on which effective crystal growth is least expected, thereby effectively inhibiting crystal growth.

Other Modifications

The present invention is not limited to the above-described embodiments, and the below-exemplified modifications may be made. Effects of the present invention can also be attained through such modifications or applications according to the operation of the present invention.

Modification 1

In Embodiment 2, the bottom of the crucible 260 has been formed into a V-shape (opening angle: 120°). Even when a crucible is partitioned to form a cassette-holder-like vessel according to the second aspect of the invention, the bottom of the crucible may be flat as in the crucible 26 shown in FIG. 3. However, in this case, rather than a-plane, m-plane of a seed crystal is preferably brought into contact with the bottom of the crucible.

Modification 2

In the aforementioned Embodiments, crucibles have not been caused to swing. However, when the employed crystal growth apparatus provides insufficient thermal convection, flux stirring means for causing, for example, a crucible or a reaction chamber (stainless steel vessel 24) to periodically swing may be employed. Through employment of such means, even under poor thermal convection, a flux may be fed with sufficient uniformity to the entire crystal growth surface.

Modification 3

In the aforementioned compositional formula of the Group III nitride-based compound semiconductor forming the target semiconductor crystal, the Group III element (Al, Ga, or In) atoms may be at least partially substituted by atoms of an element such as boron (B) or thallium (Tl), or nitrogen (N) atoms may be at least partially substituted by atoms of an element such as phosphorus (P), arsenic (As), antimony (Sb), or bismuth (Bi).

Modification 4

A p-type impurity (acceptor) including an alkaline earth metal such as magnesium (Mg) or calcium (Ca) may be added. An n-type impurity (donor) may also be added. Examples of the n-type impurity include silicon (Si), sulfur (S), selenium (Se), tellurium (Te), and germanium (Ge). These impurities (acceptors or donors) may be added in two or more species in a single operation, or two types of impurities (p- and n-types) may be added simultaneously. Briefly, these impurities may be added to a target semiconductor crystal through, for example, preliminarily melting thereof in a flux.

As described hereinabove, the present invention is useful for, for example, the production of semiconductor devices employing a Group III nitride-based compound semiconductor crystal. Examples of such semiconductor devices include light-emitting devices and photoreceptors such as LEDs and LD and other general semiconductor devices such as FETs.

What is claimed is:

1. A method for producing a semiconductor crystal in which a group III nitride-based compound semiconductor crystal is grown by reacting nitrogen (N) with a Group III element of gallium (Ga), aluminum (Al), or indium (In) in a flux mixture containing an alkali metal, said method comprising:

placing, in a crucible, one or more plate-form seed crystals each having a c-plane as a growth surface, the plate-form seed crystal comprising a group III nitride-based compound semiconductor; and supporting each seed crystal at an m-plane thereof by a supporting tool in condition that an a-plane thereof is other than contacting with the supporting tool, to thereby maintain the c-axis of the seed crystal in a horizontal direction or in an inclined direction within 45° with respect to the horizontal direction, the m-plane and the a-plane being a side wall of the plate-form seed crystal.

2. A method for producing a semiconductor crystal in which a group III nitride-based compound semiconductor crystal is grown by reacting nitrogen (N) with a Group III element of gallium (Ga), aluminum (Al), or indium (In) in a flux mixture containing an alkali metal, said method comprising:

placing one or more plate-form seed crystals having a c-plane as a crystal growth surface in a crucible whose interior is divided into a plurality of small spaces by a guide member or a partition member, the plate-form seed crystal comprising a group III nitride-based compound semiconductor; and supporting each seed crystal at an m-plane by a bottom of the crucible and supporting each seed crystal by the guide member or the partition member to prevent falling of the seed crystal, to thereby maintain a line normal to the crystal growth surface of the seed crystal in a horizontal direction or in an inclined direction within 45° with respect to the horizontal direction, the m-plane and an a-plane being a side wall of the plate-form seed crystal.

3. The method for producing a semiconductor crystal as described in claim 1, wherein two or more of said seed crystals are placed together in the crucible, to thereby provide at least one seed crystal pair, and wherein planes of the paired seed crystals on which crystal growth is least expected are maintained such that the planes are in close contact with each other.

4. The method for producing a semiconductor crystal as described in claim 2, wherein two or more of said seed crystals are placed together in the crucible, to thereby provide at least one seed crystal pair, and wherein planes of the paired seed crystals on which crystal growth is least expected are maintained such that the planes are in close contact with each other.

5. The method for producing a semiconductor crystal as described in claim 1, wherein said supporting tool comprises one of a guide member and a partition member to prevent each seed crystal from falling.

6. The method for producing a semiconductor crystal as described in claim 1, wherein said placing said one or more plate-form seed crystals comprises placing the growth surface of each of said plate-form seed crystals vertically.

7. The method for producing a semiconductor crystal as described in claim 1, wherein said a-plane of said seed crystal and said c-plane of said seed crystal have no pressure exerted from an inner wall of said crucible.

8. The method for producing a semiconductor crystal as described in claim 1, wherein said a-plane of said seed crystal and said c-plane of said seed crystal are out of contact with an inner wall of said crucible.

9. The method for producing a semiconductor crystal as described in claim 1, wherein said supporting tool contacts each of said seed crystals on said m-plane.

10. The method for producing a semiconductor crystal as described in claim 1, wherein said supporting tool comprises at least two supporting members, and wherein at least one of said supporting members is bent such that an angle of a lower portion of said one of said supporting members and a vertical line is at least 60°.

11. The method for producing a semiconductor crystal as described in claim 1, wherein an a-axis of each of the seed crystals is maintained in a vertical direction.

12. The method for producing a semiconductor crystal as described in claim 3, wherein the plate-form seed crystals comprise free-standing bulk single-crystal GaN disks, and said planes are N-polar c-planes.

13. The method for producing a semiconductor crystal as described in claim 4, wherein the plate-form seed crystals comprise free-standing bulk single-crystal GaN disks, and said planes are N-polar c-planes.

14. The method for producing a semiconductor crystal as described in claim 3, wherein said planes are c-planes.

15. The method for producing a semiconductor crystal as described in claim 4, wherein said planes are c-planes.

16. The method for producing a semiconductor crystal as described in claim 1, wherein said supporting each of said seed crystals comprises:

supporting side surfaces of each of said plate-form seed crystals in a thickness direction of said plate-form seed crystals at said m-plane.

17. The method for producing a semiconductor crystal as described in claim 2, wherein said supporting each of said seed crystals comprises:

supporting side surfaces of each of said plate-form seed crystals in a thickness direction of said plate-form seed crystals at said m-plane.

18. The method for producing a semiconductor crystal as described in claim 1, wherein the growth surface of each of the seed crystals is parallel to a vertical line of said c-plane.

* * * * *

UNITED STATES PATENT AND TRADEMARK OFFICE
CERTIFICATE OF CORRECTION

PATENT NO. : 8,216,365 B2  
APPLICATION NO. : 12/073178  
DATED : July 10, 2012  
INVENTOR(S) : Seiji Nagai et al.

Page 1 of 1

It is certified that error appears in the above-identified patent and that said Letters Patent is hereby corrected as shown below:

On the Title Page

In Item (73) add additional Assignees:

2. NGK INSULATORS, LTD.
       Nagoya-shi, Aichi-ken, JAPAN

3. OSAKA UNIVERSITY
       Suita-shi, Osaka-fu, JAPAN

Signed and Sealed this
Thirteenth Day of August, 2013

Teresa Stanek Rea
*Acting Director of the United States Patent and Trademark Office*